US008275569B2

(12) United States Patent
Horiguchi (10) Patent No.: US 8,275,569 B2
(45) Date of Patent: Sep. 25, 2012

(54) TEST APPARATUS AND DIAGNOSIS METHOD

(75) Inventor: Satoshi Horiguchi, Saitama (JP)

(73) Assignee: Advantest Corporation, Tokyo (JP)

( * ) Notice: Subject to any disclaimer, the term of this patent is extended or adjusted under 35 U.S.C. 154(b) by 279 days.

(21) Appl. No.: 12/633,660

(22) Filed: Dec. 8, 2009

(65) Prior Publication Data
US 2010/0153054 A1  Jun. 17, 2010

(30) Foreign Application Priority Data

Dec. 12, 2008 (JP) ................................. 2008-317456

(51) Int. Cl.
*G01R 27/00* (2006.01)
*G01R 31/00* (2006.01)
*G01R 15/00* (2006.01)
*G01R 31/28* (2006.01)
*G01R 31/02* (2006.01)
*G01R 1/00* (2006.01)

(52) U.S. Cl. .......... 702/120; 702/57; 702/117; 324/523; 324/525; 324/537

(58) Field of Classification Search .................. 324/500, 324/512, 522, 523, 525, 527, 537, 750.1, 324/750.15, 762.01; 702/57, 58, 64, 65, 702/117, 118, 121, 120
See application file for complete search history.

(56) References Cited

U.S. PATENT DOCUMENTS

| 6,028,439 | A | * | 2/2000 | Arkin et al. | 324/762.02 |
| 7,096,139 | B2 | * | 8/2006 | Miyazaki et al. | 702/117 |
| 7,275,197 | B2 | * | 9/2007 | Inaba et al. | 714/740 |
| 2008/0129313 | A1 | * | 6/2008 | Iwamoto | 324/555 |
| 2008/0235548 | A1 | * | 9/2008 | Yamada | 714/738 |

FOREIGN PATENT DOCUMENTS

JP  2002-207066 A  7/2002

* cited by examiner

*Primary Examiner* — Mohamed Charioui
*Assistant Examiner* — Ricky Ngon
(74) *Attorney, Agent, or Firm* — Chen Yoshimura LLP (57) ABSTRACT

Provided is a test apparatus that tests a device under test, comprising: a plurality of modules that each include an output circuit that outputs a prescribed output signal to the device under test and a measurement circuit that measures a prescribed characteristic of the device under test; and a control section that, for each module, causes the measurement circuit to measure output of the output circuit and diagnoses the module based on a measurement result of the measurement circuit. Each measurement circuit measures the output of the corresponding output circuit in parallel, and the control section is provided in common to the plurality of modules and sequentially reads the measurement result of the measurement circuit of each module.

4 Claims, 6 Drawing Sheets

TEST APPARATUS AND DIAGNOSIS METHOD

BACKGROUND

1. Technical Field

The present invention relates to a test apparatus and a diagnosis method.

2. Related Art

A conventional test apparatus that tests a device under test, such as a semiconductor chip, is provided with an output circuit that inputs a test signal into the device under test and a measurement circuit that measures a response signal from the device under test. For example, the output circuit may generate a test signal that causes the device under test to perform a prescribed operation, and the measurement circuit may judge whether the device under test is operating properly by measuring the response signal of the device under test. Generally, the test apparatus is provided with a plurality of test channels that each include an output circuit and a measurement circuit.

In order to accurately test the device under test, a self diagnosis is desirably performed periodically to determine whether each test channel is operating properly. A conventional test apparatus uses a relatively high-performance digital voltmeter (DVM) or a digital multimeter (DMM) to determine whether each of the test channels is operating properly, as shown in, for example, Japanese Patent Application Publication No. 2002-207066.

This conventional test apparatus, however, is only provided with 1 DVM, DMM, or the like. Therefore, when diagnosing the plurality of test channels, the test apparatus sequentially connects the test channels one at a time to the DVM. Therefore, a long measurement time is required when diagnosing a large number of test channels. The diagnostic time is further increased due to the switching of the test channel being diagnosed. Yet further, since the signal path from the test channels to the DVM is relatively long, the settling time is also increased.

SUMMARY

Therefore, it is an object of an aspect of the innovations herein to provide a test apparatus and a diagnosis method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising: a plurality of modules that each include an output circuit that outputs a prescribed output signal to the device under test and a measurement circuit that measures a prescribed characteristic of the device under test; and a control section that, for each module, causes the measurement circuit to measure output of the output circuit and diagnoses the module based on a measurement result of the measurement circuit.

According to a second aspect related to the innovations herein, one exemplary diagnosis method may include a diagnosis method for diagnosing a test apparatus that is provided with a plurality of modules that each include an output circuit that outputs a prescribed output signal to a device under test and a measurement circuit that measures a prescribed characteristic of the device under test, the method comprising: for each module, measuring output of the output signal with the measurement circuit and diagnosing the module based on a measurement result of the measurement circuit.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
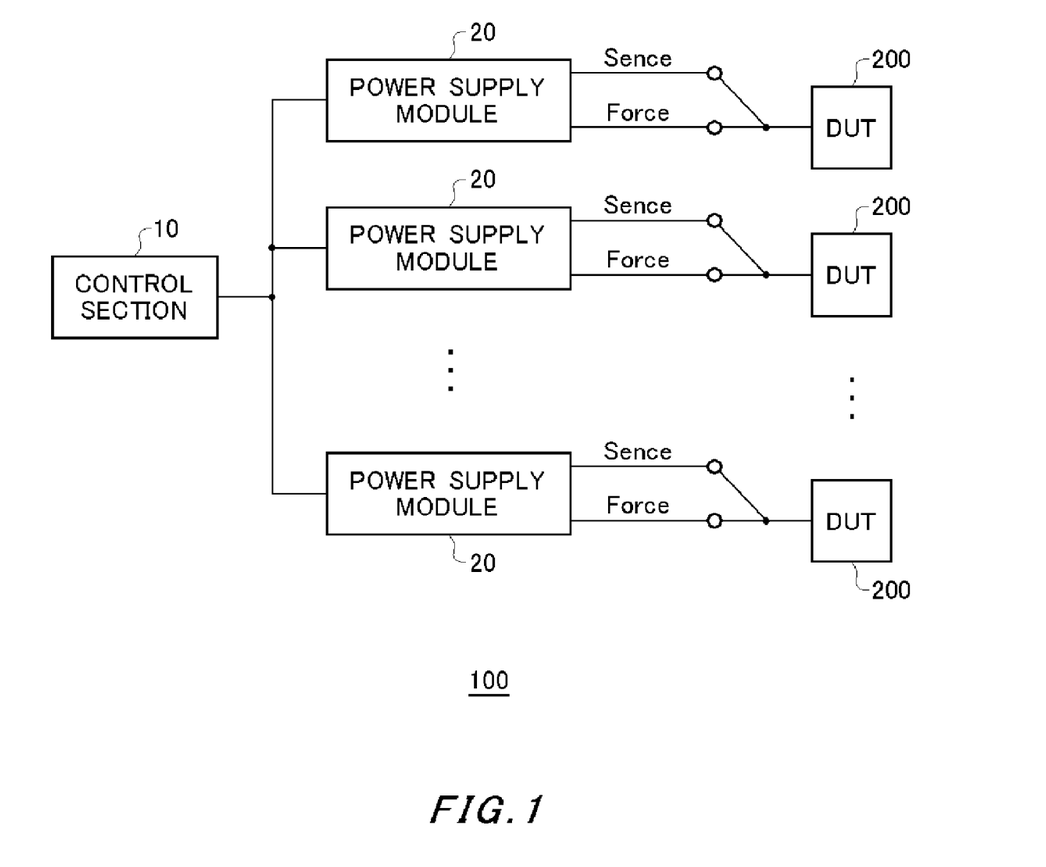
FIG. 1 is a schematic view of a test apparatus 100 according to an embodiment of the present invention.

FIG. 1 is a schematic view of a test apparatus 100 according to an embodiment of the present invention. The test apparatus 100 tests devices under test 200 such as semiconductor chips, and is provided with a control section 10 and a plurality of modules 20. The test apparatus 100 may be provided with a variety of modules 20. For example, the test apparatus 100 may be provided with a digital module that generates and measures a digital signal, an analog module that generates and measures an analog signal, a power supply module that generates supply power, and the like. The test apparatus 100 described in the following example includes a plurality of power supply modules.

Each module 20 outputs a prescribed output signal to a corresponding device under test 200. Here, the scope of the "output signal" includes supply power. For example, each module 20 may supply the corresponding device under test 200 with supply power that has a constant voltage, or may supply the device under test 200 with supply power that has a constant current. As another example, the modules 20 may supply the devices under test 200 with digital signals or analog signals.

Each module 20 measures a prescribed characteristic of the corresponding device under test 200. For example, when a module supplies the device under test 200 with supply power that is a constant voltage, the module 20 may measure the power supply current flowing through the device under test 200. As another example, when a module supplies the device under test 200 with supply power that has a constant current, the module 20 may measure the power supply voltage applied to the device under test 200. Each module 20 may judge the acceptability of the device under test 200 based on whether the measured value is within a prescribed range.

As another example, when a module 20 inputs a prescribed analog signal or digital signal to the device under test 200, the module 20 may measure the response signal output by the device under test 200. The module 20 may judge the acceptability of the device under test 200 based on whether a characteristic of the response signal from the device under test 200 fulfills a prescribed condition.

The control section 10 controls each of the modules 20. For example, the control section 10 may control the voltage value, the current value, the output timing, and the like of each signal output by a module 20. The control section 10 may control the measurement timing of each module 20. The control section 10 may judge whether the measurement result from each module 20 is within a prescribed allowable range. Using this control, the test apparatus 100 can test the devices under test 200.

The control section 10 causes each module 20 to perform a self diagnosis. In this case, the control section 10 may switch whether a module 20 tests the device under test 200 or performs a self diagnosis by controlling in advance switches or the like inside of each module 20.

Figure 2:
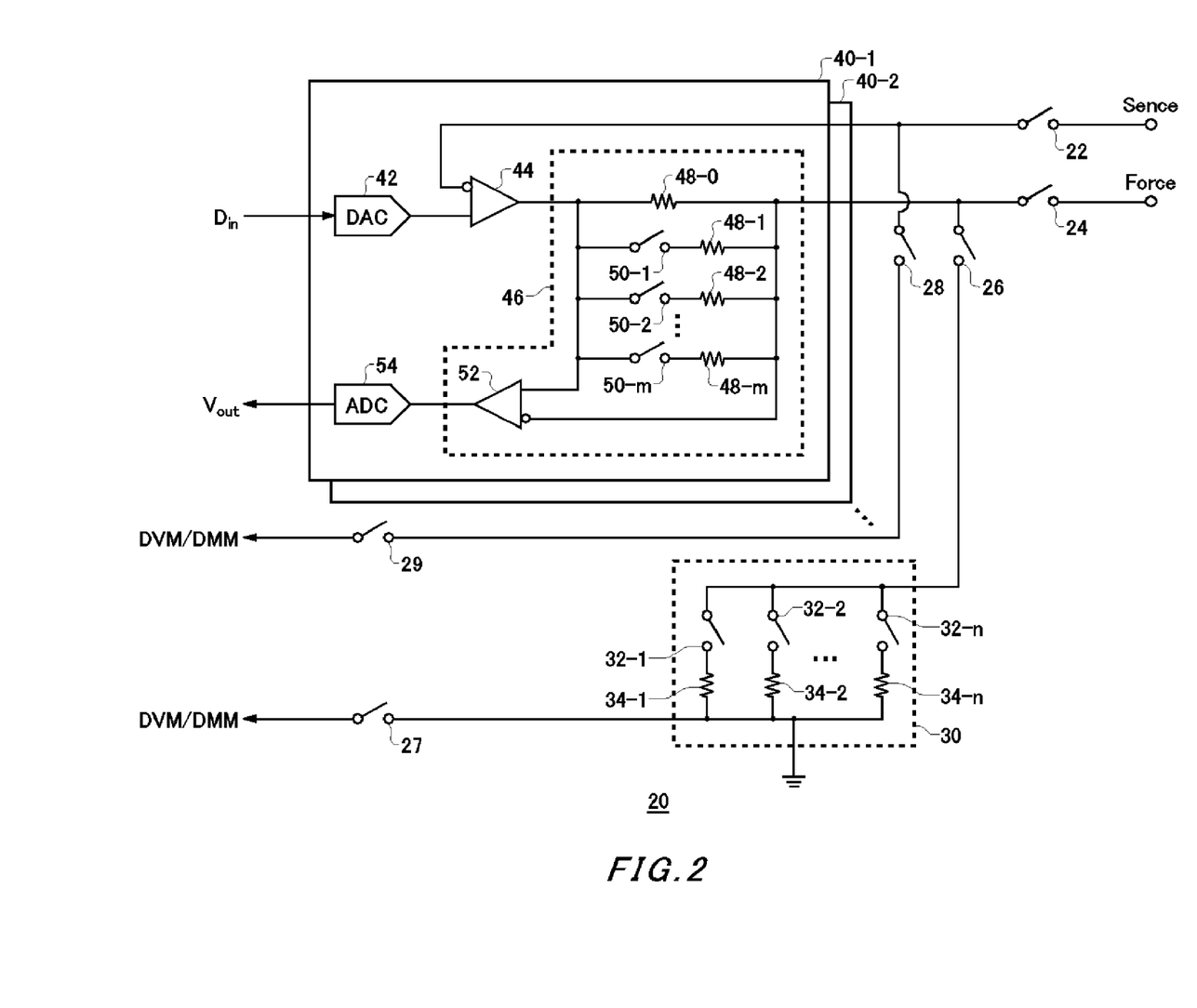
FIG. 2 shows a configuration of a module 20.

FIG. 2 shows a configuration of a module 20. This example shows the configuration of only one module 20, but the other modules 20 may have the same configuration. The module 20 includes a plurality of channels 40, a diagnostic load section 30, and a plurality of switches 22, 24, 26, 27, 28, and 29.

Each channel 40 may have the same function and configuration, and may supply the supply power to a different pin of the device under test 200. The power supply voltage detected near the device under test 200 is fed back to each channel 40. For example, each channel 40 supplies the device under test 200 with the supply power via a force pin, and the power supply voltage is fed back thereto via a sence pin. A force and sence pin may be provided for each channel 40.

Each channel 40 includes a DAC 42, a power amplifier 44, a current detecting section 46, and an ADC 54. The DAC 42 and the power amplifier 44 function as the output circuit that outputs the prescribed output signal to the device under test 200. In the present example, the DAC 42 outputs a voltage corresponding to a setting value Din supplied from the control section 10 or the like. The power amplifier 44 outputs supply power corresponding to the voltage output by the DAC 42. Instead, the power amplifier 44 may have the power supply voltage fed back thereto via a sence terminal and adjust the output voltage such that the power supply voltage matches the voltage supplied from the DAC 42. In other words, the output circuit in the present embodiment outputs supply power that has a constant voltage.

The current detecting section 46 and the ADC 54 function as the measurement circuit that measures a prescribed characteristic of the device under test 200. The current detecting section 46 is provided between an output end of the power amplifier 44 and a force terminal, and detects the power supply current output by the power amplifier 44. The ADC 54 converts the current value detected by the current detecting section 46 into a digital value, and outputs this digital value to the control section 10. In other words, the measurement circuit in the present embodiment measures the power supply current using a voltage source current measurement (VSIM) test.

The current detecting section 46 includes a plurality of current sensing resistors 48, a plurality of switches 50, and a differential circuit 52. The switches 50 control whether each current sensing resistor 48 is connected between the power amplifier 44 and the force terminal. By controlling each switch 50, the combined resistance value of the current sensing resistors 48 connected between the power amplifier 44 and the force terminal can be adjusted. In this way, the test apparatus 100 can adjust the measurement range of the power supply current.

The differential circuit 52 outputs the potential difference between the ends of the combined resistance resulting from the current sensing resistors 48 selected by the switches 50. The value of the combined resistance can be calculated from the state of the switches 50, and so the control section 10 can calculate the power supply current flowing through the combined resistance based on this resistance value and the potential difference.

The diagnostic load section 30 is provided in common to the plurality of channels 40, and is used when each channel 40 performs a self diagnosis. The diagnostic load section 30 includes load resistors 34 that are connected in series between (i) a ground potential and (ii) an input end of the measurement circuit and the output end of the output circuit in each channel 40. The diagnostic load section 30 may include a plurality of switches 32 and a plurality of the load resistors 34 having different resistance values provided to correspond to the plurality of current sensing resistors 48.

The switches 32 select the load resistors 34 according to the combined resistance value of the current detecting section 46, and connect the output end of the output circuit to the input end of the measurement circuit. For example, the switches 32 may select the load resistors 34 such that the combined resistance of (i) the load resistors 34 and (ii) the combined resistance of the current detecting section 46 is greater than a predetermined value. As a result, during the self diagnosis, an excessive current can be prevented from flowing through the current detecting section 46. Next, the self diagnosis process of the modules 20 will be described.

Figure 3:
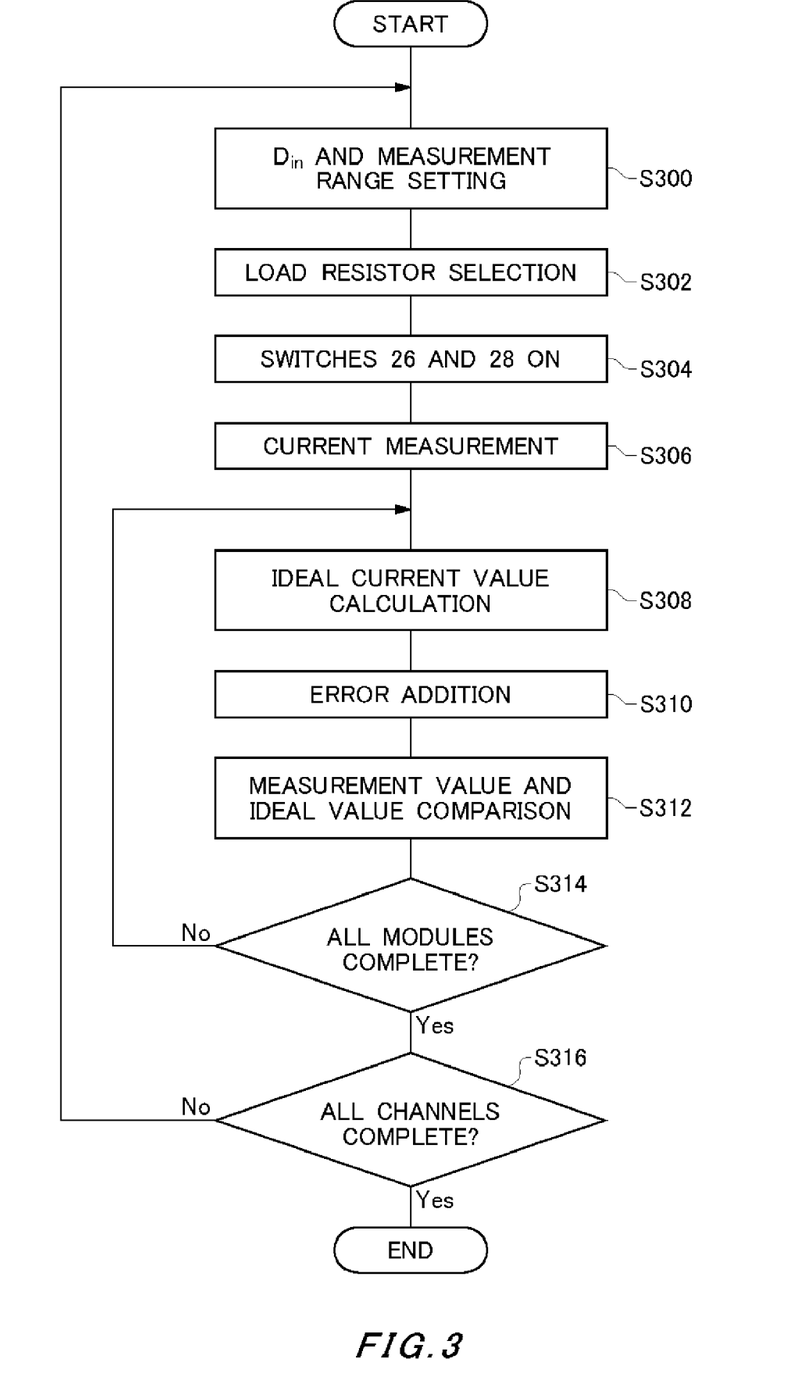
FIG. 3 is a flow chart showing an exemplary process of the self diagnosis of a module 20.

FIG. 3 is a flow chart showing an exemplary process of the self diagnosis of the modules 20. First, the control section 10 sets the measurement range and the setting value Din for the channel 40 to be diagnosed in each module 20 (S300). As described above, the measurement range can be set by controlling the resistance value of the current detecting section 46.

Next, the control section 10 selects load resistors 34 in the diagnostic load section 30 (S302). As described above, the control section 10 can select the load resistors 34 by controlling the switches 32.

Next, the control section 10 connects the diagnostic load section 30 to the output end of the output circuit and the input end of the measurement circuit for the channel 40 being diagnosed in each module 20. As described above, the control section 10 may connect the diagnostic load section 30 to the output end of the output circuit and the input end of the measurement circuit by controlling the switches 22 and 24 to be in an OFF state and controlling the switches 26 and 28 to be in an ON state (S304).

Next, the measurement circuit in the channel 40 being diagnosed in each module 20 measures the current flowing through the diagnostic load section 30 from the power amplifier 44 (S306). As described above, the current detecting section 46 can detect the current based on the potential difference between the ends of the current sensing resistor 48.

In the diagnostic process of the present embodiment, the measurement circuit provided to the channel 40 being diagnosed in each module 20 is used to measure the output of the output circuit of the channel 40. Therefore, the measurement circuit in each channel 40 being diagnosed in each module 20 can measure the output of the corresponding output circuit in parallel. In the example shown in FIG. 3, the processes from S300 to S306 may be performed for each module 20 in parallel. As a result, the measurement time can be decreased.

Next, the control section 10 sequentially reads the measurement results of the channel 40 being diagnosed in each module 20, and sequentially performs the processes from S308 to S312 for each module 20. Each channel 40 may be provided with a buffer memory that holds the measurement results.

The control section 10 calculates an ideal value of the current to be measured by each measurement circuit, based on the resistance value of the selected load resistors 34 and the setting value Din set for the channel 40 (S308). For example, the control section 10 may calculate this ideal value by dividing the setting value Din by resistance value of the load resistors 34.

The resistance value of each load resistor 34 is desirably measured in advance. For example, the control section 10 may measure the resistance value of each load resistor 34 in advance using a high-efficiency common measurement device, such as a DVM or a DMM, provided to the test apparatus 100. In such a case, the control section 10 may control switches 26, 27, 28, and 29 to be in the ON state.

Next, the control section 10 adds or subtracts an error component to or from the calculated ideal value (S310). This error may be the measurement error of the ADC 54 and the output voltage error relative to the setting value Din in the DAC 42. The control section 10 may be supplied in advance with a maximum value predicted for this error, and may add or subtract this maximum value to or from the ideal value.

Next, the control section 10 compares (i) the ideal value to or from which the error was added or subtracted to (ii) the measurement value obtained at S306 (S312). The control section 10 may determine that the channel 40 is operating properly when the difference between the measured value and the resulting ideal value is within a predetermined range.

Next, the control section 10 judges whether the diagnosis of the selected channels 40 has been performed for all of the modules 20 (S314). If diagnosis has yet to be performed for some of the modules 20, the control section 10 repeats the processes from S308 to S312 for the next module 20.

If it is judged at S314 that diagnosis of the selected channels 40 has been performed for all of the modules 20, the control section 10 then judges whether the all of the channels 40 have been diagnosed in each module 20 (S316). If there are channels 40 that have yet to be diagnosed, the control section 10 changes the channel 40 being diagnosed in each module 20. As described above, the control section 10 may change the channel 40 being diagnosed by controlling the switches 26 and 28.

The control section 10 then repeats the processes from S300. In other words, when diagnosis is completed for the channel 40 being diagnosed in each module 20, the control section 10 controls the switches in each module 20 to select the next channel 40 to be diagnosed. The outputs of the output circuits of the selected channels 40 are then measured in parallel (S300 to S306) and the measurement results are sequentially read from each channel 40 to perform the diagnosis (S308 to S314).

If it is judged at S316 that all of the channels 40 have been diagnosed, the control section 10 ends the self diagnosis process. As a result of the above processes, all of the channels 40 in all of the modules 20 can be diagnosed. Since the processes from S300 to S306 can be performed in parallel for a plurality of modules 20, the self diagnosis time can be decreased. In particular, the large increase in measurement time caused by a large increase in the number of modules 20 can be prevented.

Furthermore, since the measurement circuit provided to each module 20 is used to measure the output of the output circuit of the module 20, the self diagnoses can be performed without sequentially connecting the channels 40 to the common measurement device, e.g. the DVM or the DMM. Therefore, the time spent switching connections is decreased.

The measurement path length between the output circuit and the measurement circuit in each module 20 is less than the measurement path length from the output circuit to the common measurement device, e.g. the DVM or the DMM. Therefore, the settling time can be shortened.

Furthermore, the common measurement device, e.g. the DVM or the DMM, can measure the signal more accurately than the measurement circuit in each channel 40. Since the resistance value of each load resistor 34 is measured in advance using the common measurement device, e.g. the DVM or the DMM, the resistance value of the load resistors 34 can be accurately measured. These accurately measured resistance values are used to calculate the ideal value described above, and so the error component added to or subtracted from the ideal value can be minimized. Since the load resistors 34 are provided in common to a plurality of channels 40, the measurement time is not increased very much when the common measurement device, e.g. the DVM or the DMM, is used to measure the resistance values of the load resistors 34 in advance.

By supplying a control signal, that is identical to the control signal used in the case where the test apparatus 100 measures characteristics of a plurality of devices under test 200 in parallel, to the output circuit and the measurement circuit of each channel 40 in parallel, the control section 10 can cause each measurement circuit to measure the output of the corresponding output circuit in parallel. In other words, the control section 10 may perform the diagnosis of each module 20 using a function of the test apparatus 100 for simultaneously measuring a plurality of devices under test 200. The control signal described above may be a signal that controls the voltage value, the current value, the output timing, or the like of the signal output by each module 20, a signal that controls the measurement timing of each module 20, or a signal that reads the measurement results of each module 20, for example.

Figure 4:
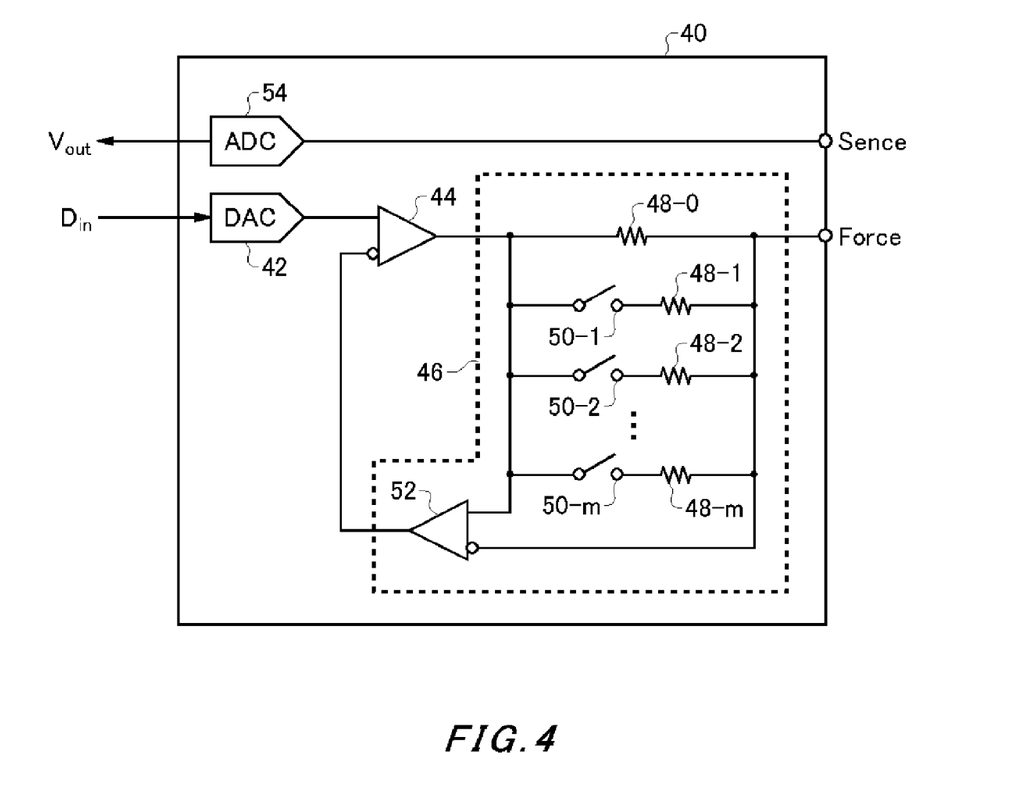
FIG. 4 shows another exemplary configuration of a channel 40.

FIG. 4 shows another exemplary configuration of a channel 40. FIG. 2 shows a configuration of a channel 40 that performs a voltage source current measurement, but the channel 40 of the present embodiment performs a current source voltage measurement. Furthermore, the DAC 42, the power amplifier 44, and the current detecting section 46 function as the output circuit in the present embodiment, and the ADC 54 functions as the measurement circuit.

In this case, the value of the power supply current to be output from the channel 40 is set in the DAC 42. The current detection results of the current detecting section 46 are fed back to the power amplifier 44. The power amplifier 44 controls its own output voltage such that the voltage output by the current detecting section 46 matches the voltage output by the DAC 42. In this way, the power supply current output from the channel 40 can be held at a constant value.

The ADC 54 is supplied with the power supply voltage detected near the device under test 200, via the sence terminal. With this configuration, a current source voltage measurement can be performed that involves measuring the power supply voltage while the power supply current is constant. The following describes the self diagnosis performed for the channel 40 of the present embodiment.

Figure 5:
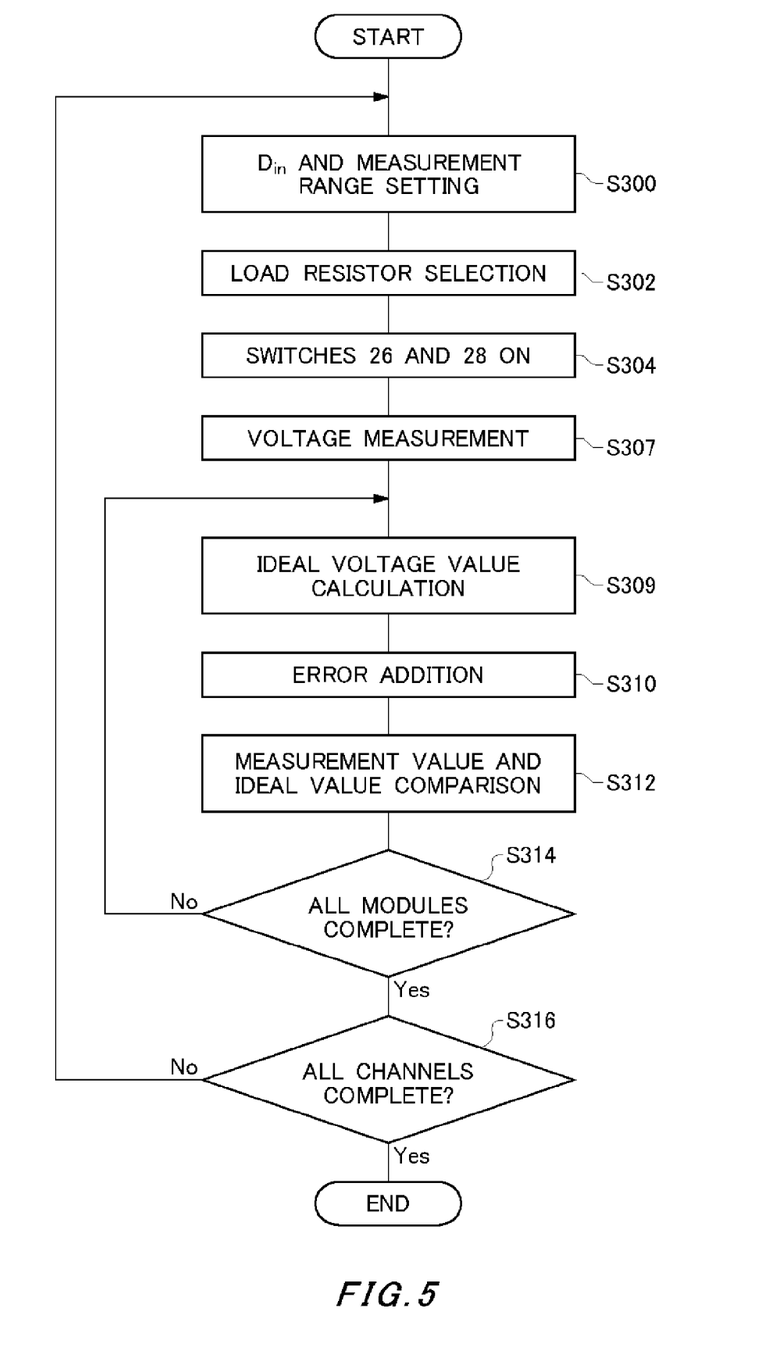
FIG. 5 is a flow chart showing an exemplary process of the self diagnosis of a module 20.

FIG. 5 is a flow chart showing an exemplary process of the self diagnosis of a module 20. This process is similar to the process described in FIG. 3. However, in place of the current measurement process at S306 in FIG. 3, in the present embodiment, the ADC 54 measures the power supply voltage (S307). When the self diagnosis is performed, the sence terminal and the force terminal are desirably electrically connected. For example, each module 20 may include a switch that switches whether the sence terminal and the force terminal are connected. As another example, instead of the device under test 200, a diagnostic circuit board that electrically connects the sence terminal and the force terminal may be connected to each module 20.

After the processes from S300 to S307 are completed for each module 20, the control section 10 sequentially diagnoses the modules 20 according to the processes from S309 to S314. The processes from S309 to S316 may be the same as the processes from S308 to S314 described in FIG. 3. However, in place of the ideal current calculation process at S308 in FIG. 3, in the present embodiment, the ideal voltage value is calculated (S309). The control section 10 may calculate the ideal voltage value by multiplying the setting value Din of the DAC 42 by the resistance value of the selected load resistors 34.

As a result of the processes described in FIG. 5, diagnosis of the channels 40 using current source voltage measurement can be performed efficiently. Even if the channels 40 have a different configuration, each channel 40 can be diagnosed using a similar process. For example, the channel 40 may be configured for performing a voltage source voltage measurement. In this case, each channel 40 can be diagnosed efficiently using a method similar to the processes described in relation to FIGS. 3 and 5.

As shown in FIGS. 2 and 4, the voltage source current measurement and the current source voltage measurement can be performed using the same circuit configuration. Each channel 40 may further include switches for switching the connections between each circuit. By controlling these switches, the control section 10 can cause each of the channels 40 to have the circuit configuration shown in one of FIG. 2 and FIG. 4. When performing a voltage source voltage measurement, the sence terminal may be connected to each negative input terminal of the ADC 54 and the power amplifier 44 without using the current detecting section 46.

Figure 6:
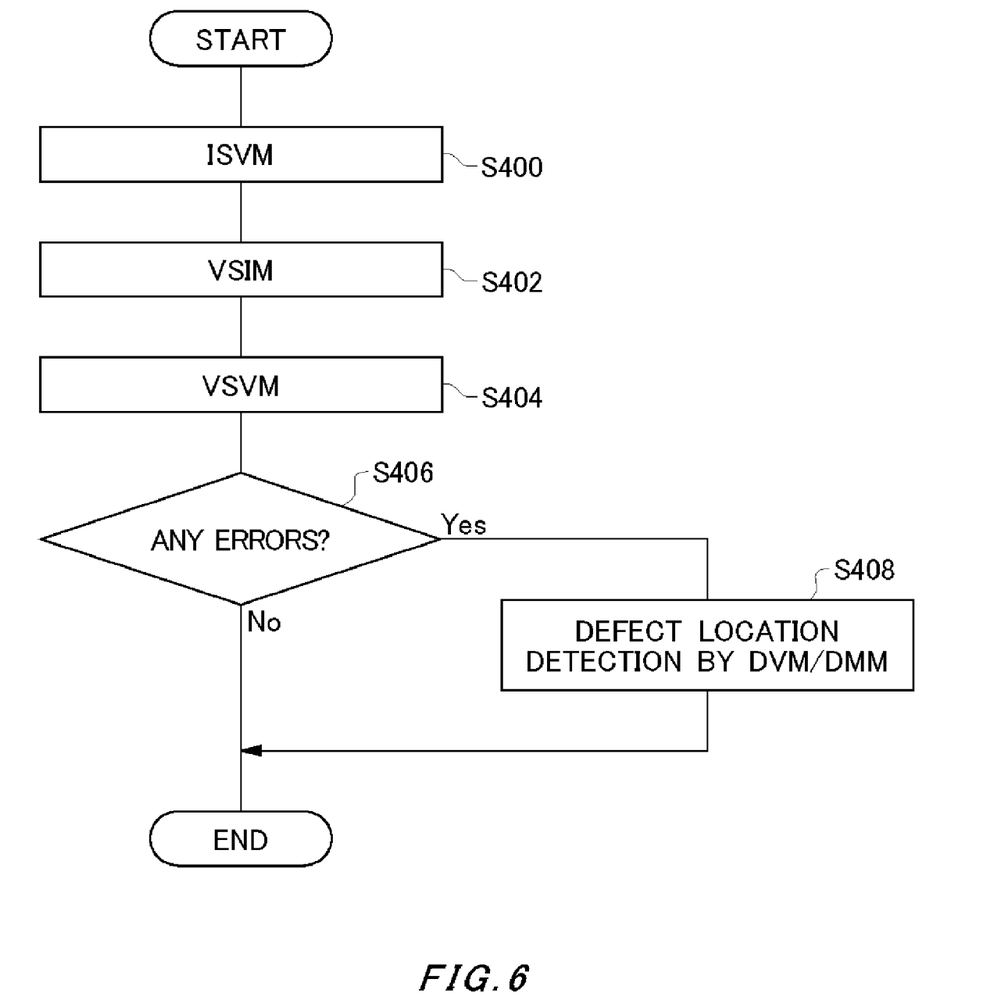
FIG. 6 is a flow chart showing another exemplary process of the diagnosis by the test apparatus 100.

FIG. 6 is a flow chart showing another exemplary process of the diagnosis by the test apparatus 100. The control section 10 of the present embodiment sets each channel 40 to have a configuration for performing a current source voltage measurement (ISVM), a configuration for performing a voltage source current measurement (VSIM), and a configuration for performing a voltage source voltage measurement (VSVM), and performs the self diagnoses described in FIGS. 3 and 5 for each of these configurations (S400 to S404).

The control section 10 judges whether an error occurs in any of the channels 40 during any of the self diagnoses (S406). If none of the channels 40 have an error, the control section 10 ends the self diagnostic process of the test apparatus 100.

If a channel 40 has an error, the control section 10 connects this channel 40 to the common measurement device, e.g. the DVM or DMM, and performs a diagnosis (S408). For example, the control section 10 may control the switches 26, 27, 28, and 29 described in FIG. 2 to be in the ON state, and measure the output of the output circuit using the common measurement device, e.g. the DVM or DMM. When the measured value of the common measurement device, e.g. the DVM or DMM, has an error that is beyond the allowable range for the setting value Din, the control section 10 judges that the output circuit is in error. When the measured value of the common measurement device, e.g. the DVM or DMM, has an error that is within the allowable range for the setting value Din, the control section 10 judges that the output circuit is operating properly, and therefore judges that the measurement circuit caused the error.

With this process, the test apparatus 100 can identify whether the output circuit or the measurement circuit is malfunctioning. Furthermore, in the same manner as the self diagnostic processes described in FIGS. 3 and 5, when the control section 10 judges a channel 40 to be defective, the test apparatus 100 may measure the output of the output circuit of this channel 40 using the common measurement device, e.g. the DVM or DMM, to diagnose this output circuit.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention. For example, the embodiments above describe the self diagnosis of a power supply module, but the same self diagnosis can be performed for other types of test modules.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
 a plurality of modules that each include:
  a plurality of channels that each have an output circuit that outputs a prescribed output signal to the device under test and a measurement circuit that measures a prescribed characteristic of the device under test;
  a load resistor; and
  switches that each connect the load resistor to an output end of the output circuit and to an input end of the measurement circuit of a corresponding channel under measurement from among the plurality of channels, the test apparatus further comprising
 a control section, provided in common to the plurality of modules, that causes the measurement circuit in each module to measure output of the corresponding output circuit, sequentially reads a measurement result of the measurement circuit in each module, and diagnoses each module by (i) calculating an ideal value to be measured by the measurement circuit based on a setting value of the output signal output by the output circuit and a resistance value of the load resistor and (ii) comparing a measurement value measured by the measurement circuit to the ideal value, wherein
 measurement of the output signal of each output circuit by the corresponding measurement circuit is performed in parallel for the plurality of modules, and
 when diagnosis is completed for the channel under measurement in each module, the control section controls the switches in each module to select the next channel to be diagnosed, measures the output of each output circuit in the selected channels in parallel, and sequentially reads the measurement result of each channel to diagnose the channel.

2. The test apparatus according to claim 1, further comprising a common measurement device that is provided in common to a plurality of the modules, wherein when the control section judges that a channel is defective, the control section diagnoses the output circuit of the channel by using the common measurement device to measure the output of the output circuit of the channel.

3. The test apparatus according to claim 2, wherein measurement path length from the output circuit to the measurement circuit in each module is less than measurement path length from the output circuit to the common measurement device.

4. The test apparatus according to claim 2, wherein
the common measurement device can measure a signal more accurately than the measurement circuit, and
the control section uses the common measurement device to measure in advance a resistance value of each load resistor.

* * * * *